United States Patent [19]

Oda et al.

[11] 4,249,259
[45] Feb. 3, 1981

[54] DIGITAL CHANNEL SELECTION APPARATUS

[75] Inventors: Kanji Oda, Kumagaya; Hisashi Nakano, Saitama, both of Japan

[73] Assignee: Tokyo Shibaura Denki Kabushiki Kaisha, Kawasaki, Japan

[21] Appl. No.: 30,525

[22] Filed: Apr. 16, 1979

[30] Foreign Application Priority Data

Apr. 21, 1978 [JP] Japan .................... 53/46682

[51] Int. Cl.³ ............................................ H04B 1/06
[52] U.S. Cl. .................................. 455/182; 455/192
[58] Field of Search ........................... 325/418–423, 325/453, 464, 468; 455/179, 182, 185, 192; 358/191.1, 195.1, 191, 195

[56] References Cited

U.S. PATENT DOCUMENTS

| 4,085,371 | 4/1978 | Mogi et al. | 325/464 |
| 4,100,578 | 7/1978 | Arneson | 358/191 |
| 4,123,716 | 10/1978 | Borg | 325/464 |

Primary Examiner—Jin F. Ng
Attorney, Agent, or Firm—Cushman, Darby & Cushman

[57] ABSTRACT

A digital channel selection apparatus comprising a memory, a digital-to-analog converter for converting digital information read out of the memory to an analog tuning voltage, a voltage-controlled tuner which is tuned to an incoming RF carrier frequency on a selected channel in response to the analog tuning voltage, an automatic fine tuning discriminator connected to the tuner and a digital automatic fine tuning circuit responsive to the automatic fine tuning discriminator to vary the analog tuning voltage to effect an automatic fine tuning control, in which in addition to the digital automatic fine tuning control an analog automatic fine tuning control is effected to carry out reliable automatic fine tuning control. To this end, a small fraction of an analog output voltage, from the automatic fine tuning discriminator, which has a magnitude dependent upon an output intermediate carrier frequency of the tuner is superposed onto the output voltage of the digital-to-analog converter.

3 Claims, 3 Drawing Figures

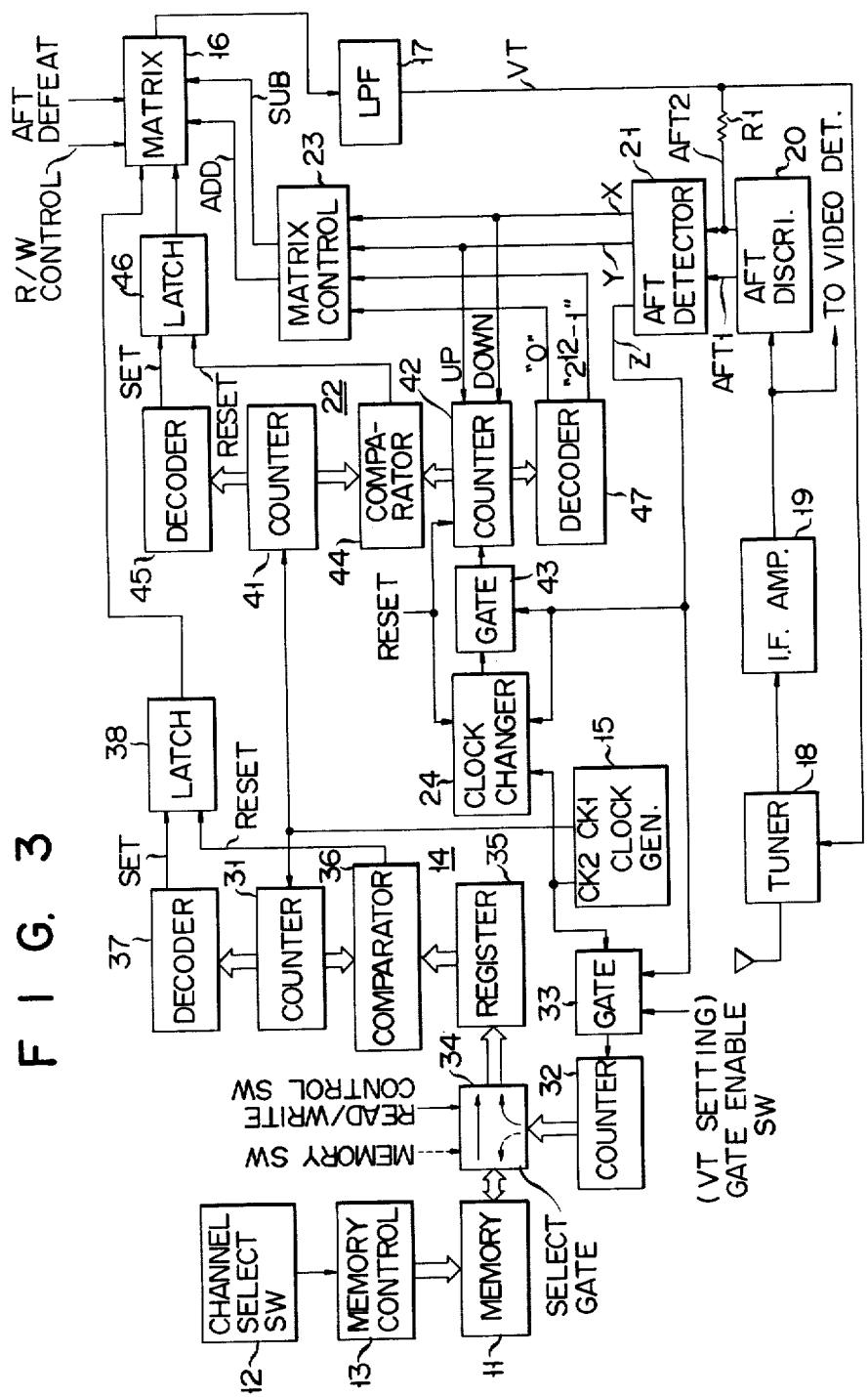
F I G. 3

DIGITAL CHANNEL SELECTION APPARATUS

This invention relates to an electronic digital channel selection apparatus for use in a television receiver etc.

Some television receivers now on the market use a tuner including varactors which function as a voltage-controlled capacitor. In the varactor tuner a tuning voltage having a magnitude preset by a potentiometer is applied to the varactors in response to the channel selection to cause the tuner to tune to a television picture carrier frequency on the selected channel. Since the tuning elements suffer drift, such a varactor tuner necessarily requires a manual fine tuning or automatic fine tuning (AFT) control to cause the tuner to accurately tune to the selected RF carrier frequency.

Thanks to the recent advance of the integrated circuit techniques an electronic digital tuner has been developed which requires no potentiometers. In the digital tuner, digital information representing a certain channel is converted by a digital-to-analog converter to an analog tuning voltage which in turn is applied to voltage-controlled tuning elements such as varactors to permit selection of a desired channel. Even such a digital tuner necessarily requires an AFT control and this control is done in a digital fashion.

In a digital tuner as disclosed in the prior application Ser No. 12,461, filed Feb. 15, 1979, in order to effect a digital AFT control, AFT clock signals are counted by an AFT counter to minutely vary the magnitude of a tuning voltage applied from a digital-analog converter to a voltage-controlled tuner. The output intermediate carrier frequency of the tuner is detected by an AFT discriminator so that when output carrier frequency coincides with a predetermined intermediate carrier frequency within a predetermined allowable range of, for example, ±20 KHz the counting operation of the AFT counter is stopped whereby the tuner tunes to the selected channel.

The width of variation of the oscillation frequency of a local oscillator which is caused by counting a one-shot AFT pulse is different for each channel. For example, the variation width is 5 KHz for a channel in VHF band and 50 KHz for a channel in UHF band. For channels in which the width of a frequency variation caused from the counting of the one-shot AFT pulse exeeds the allowable range of the output intermediate frequency of the tuner, no complete AFT control is effected and thus there occurs a phenomenon in which a local oscillation frequency is repeatedly shifted up or down outside the allowable range. As a result, a fine picture will not be obtained.

It is accordingly the object of this invention is to provide a digital channel selection apparatus which effects a reliable AFT control using a simple arrangement.

In brief, the object of this invention is attained by effecting, in addition to a main digital AFT control, an auxiliary analog AFT control in a digital channel selection apparatus of the type in which a digital AFT control is carried out.

This invention can be more fully understood from the following detailed description when taken in conjunction with the accompanying drawings, in which:

FIG. 3 is a block diagram showing in detail a tuning pulse generator and AFT pulse generator of FIG. 1.

Figure 1:
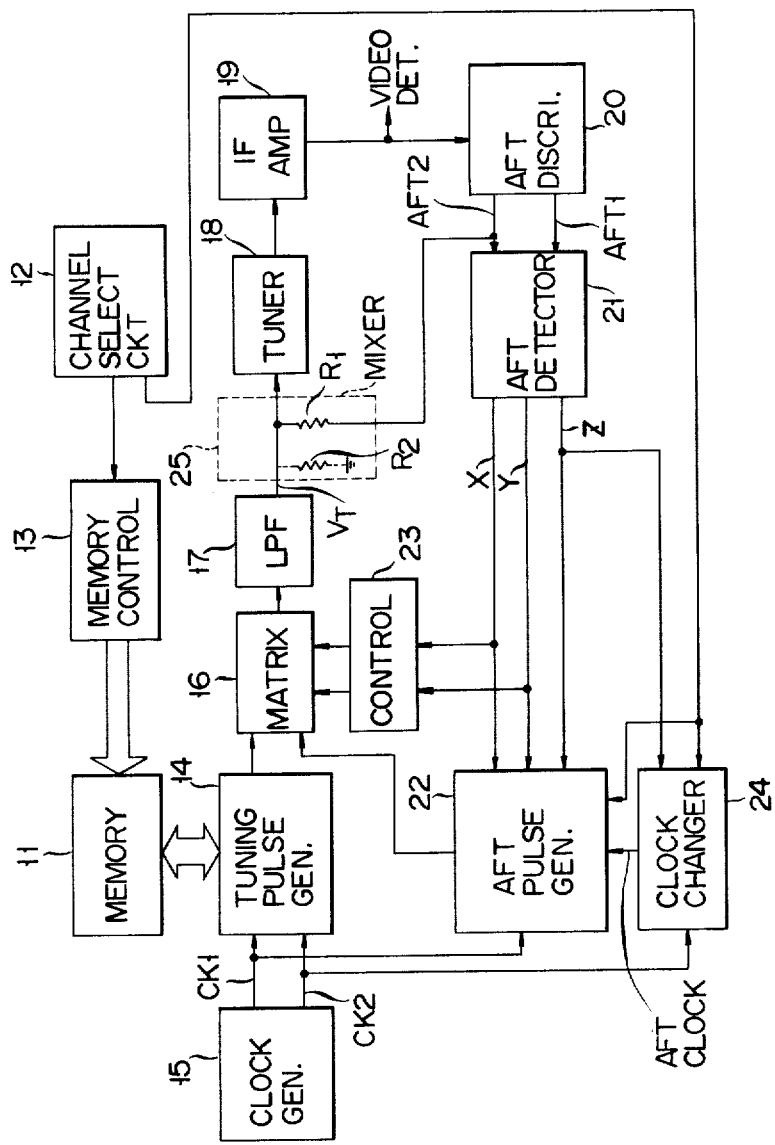
FIG. 1 is a schematic block diagram showing a digital channel selection apparatus of this invention.

An electronic digital channel selection apparatus of this invention will now be explained below by referring to FIG. 1.

The channel selection apparatus includes a digital memory circuit 11 having memory locations for storing digital signals representing a plurality of television channels. Upon depressing one of channel selection keys in a channel selection circuit 12, serial digital information corresponding to the depressed key is sent to a memory control circuit 13. The memory control circuit 13 delivers to the memory 11 a parallel address signal specifying a memory location corresponding to the selected television channel.

During the read mode or television receiving mode the digital information on the television channel is read out of the memory 11 in response to the channel selection and it is delivered to a tuning pulse generator 14. The tuning pulse generator 14 forms a train of tuning pulses with a predetermined period and a duration or duty factor which is a function of digital information read out of the memory 11, under the control of clock pulses CK1 of a relatively high frequency of, for example, 2.058 MHz from a clock pulse generator 15. The tuning pulse train is supplied to a lowpass filter 17 through a matrix circuit 16 which serves as an amplifier until the AFT control is started. The lowpass filter 17 forms an analog tuning voltage $V_T$ having a magnitude proportional to the duration of the tuning pulse train. The analog tuning voltage $V_T$ is supplied to voltage-controlled tuning elements such as varactors in the RF amplifier, local oscillator and mixer circuit of the tuner 18. Thus, the tuner 18 is made to tune to an RF carrier frequency of the selected TV channel. The tuner 18 converts an incoming RF picture carrier frequency to an intermediate carrier frequency. An intermediate-frequency video signal is amplified by an intermediate-frequency amplifier 19 and supplied to a video detector (not shown).

It takes a few tens of milliseconds from the selection of a channel until the output voltage $V_T$ of the lowpass filter 17 has a magnitude corresponding to a digital signal which has been read out of the memory 11. The AFT control is effected after the output voltage $V_T$ of the lowpass filter is caused to have the magnitude corresponding to the selected channel.

An AFT discriminator 20 having an S-shaped frequency-voltage response centered at a predetermined intermediate frequency of 45.75 MHz is connected to the intermediate frequency amplifier 19 for AFC control. The AFT discriminator 20 is arranged to form AFT analog signals $AFT_1$ and $AFT_2$ which are opposite polarity with respect to a reference DC voltage and have magnitudes dependent upon the output intermediate carrier frequency of the tuner 18. An AFT detector 21 is connected to the AFT discriminator 20 to produce a high level output signal X, Y or Z depending upon whether the output intermediate carrier frequency of the tuner 18 is much lower than, much higher than or within an allowable range about the intermediate frequency of 45.75 MHz, respectively.

An AFT pulse generator 22 is provided to produce an AFT pulse train having the same period as that of the tuning pulse train, under the control of the clock pulse CK1. The AFT pulse train is supplied to the matrix circuit 16. The pulse duration of the AFT pulse train varies dependent upon the output state of the AFT detector 21. The matrix circuit 16 combines the tuning pulse train and AFT pulse train in a ratio of, for example, 2:1. Therefore, the one step variation in duration of the AFT pulse train brings about a frequency variation corresponding to one half the variation of a local oscillation frequency caused by the one step variation in duration of the tuning pulse train. A combination mode (addition mode or subtraction mode) of the matrix is set by a matrix control circuit 23 which is responsive to the outputs X and Y of the AFT detector 21.

During the AFT control the output voltage of the lowpass filter 17 is gradually increased or decreased to permit the tuner 18 to tune to the incoming RF carrier frequency. When the tuner 18 tunes exactly to the RF carrier frequency the intermediate carrier frequency of the tuner 18 becomes a predetermined value to cause the AFT detector 21 to produce a correct tuning detection signal Z. The signal Z is produced each time the output intermediate carrier frequency of the tuner coincides with the predetermined intermediate frequency (45.75 MHz) within a predetermined allowable range ($\pm$20 KHz). The signal Z fixes the pulse duration of the AFT pulse train and the combination mode of the matrix circuit 16.

During the AFT control the output voltage $V_T$ of the lowpass filter 17 varies at a rate proportional to the frequency of the AFT clock pulse which is applied to the AFT pulse generator 22. The AFT discriminator 20 has an operation delay of about 10 milliseconds and the lowpass filter 17 has an operation delay of about 30 to 40 milliseconds. In consequence, when the AFT clock pulse supplied to the AFT pulse generator 22 has a relatively high frequency, that is, the output voltage of the lowpass filter 17 varies at a relatively great rate, the timing in which the AFT detector 21 forms the output signal Z is delayed with respect to the timing in which the output intermediate carrier frequency of the tuner 18 is shifted to the predetermined value. Namely, at the time when the AFT detector 21 forms the output signal Z the output intermediate carrier frequency of the tuner 18 is displaced off the predetermined frequency and thus the readjustment of the frequency will be necessary. If an AFT clock pulse of lower frequency is used taking the operation delay of the lowpass filter 17 into consideration, then the AFT control will take a relatively long time. In order to effect AFT control in a shorter time a clock changer 24 is provided to cause the frequency of the AFT clock pulse being applied to the AFT pulse generator 22 to be sequentially lowered over a plurality of intervals of the AFT control. The clock changer 24 comprises a frequency divider for frequency-dividing a clock pulse CK2 (512 Hz) from the clock pulse generator 15 into clock pulses $F_1$(256 Hz), $F_2$(128 Hz), $F_3$(64 Hz) and $F_4$(32 Hz) and gate circuits for causing a frequency-divided clock signal being supplied to the AFT pulse generator 22 to be changed to a lower frequency clock signal in response to the output signal Z of the AFT detector 21. The AFT operation is terminated when the lowest frequency clock pulse $F_4$ is applied to the AFT pulse generator 22.

The AFT pulse generator 22 and clock changer 24 are connected to the channel selection circuit 12 and arranged to operate at the time when the output voltage $V_T$ of the lowpass filter 17 is allowed to have a magnitude corresponding to the selected channel.

During the write mode or tuning voltage-setting mode (program mode), digital information on a selected television channel is produced by the tuning pulse generator 14, and is stored in that memory location of the memory circuit 11 which corresponds to the selected television channel. During the write mode, the AFT pulse generator 22 and clock changer 24 remain inoperative, and the matrix circuit 16 acts as an amplifier for the tuning pulse train.

In the channel selection apparatus shown in FIG. 1 the tuning pulse generator 14, matrix circuit 16 and lowpass filter 17 function as a digital-to-analog converter for converting digital information read out of the memory 11 to an analog tuning voltage and the AFT detector 21, AFT pulse generator 22, matrix control circuit 23 and clock changer 24 function as an AFT circuit for effecting AFT control in response to the AFT discriminator 20. Such channel selection apparatus is the same as the apparatus as set out in detail in the aforesaid prior application. According to the invention the output voltage $V_T$ of the lowpass filter 17 and a fraction of the analog output voltage AFT2 of the AFT discriminator 20 are mixed together in the mixer 25 and then applied to the tuner 18. In the channel selection apparatus of this invention the AFT control is performed by a combination of a main digital control and anxiliary analog control. The object of the analog control is to prevent such a phenomenon that during the reception of a channel in the UHF band the intermediate carrier frequency of the tuner under the AFT operation is shifted up or down beyond the allowable range. Although such a phenomenon can be solved by extending the allowable range, this solution will lower AFT sensitivity. Another solution method is to increase the number of bits of those counters having the same number of bits which are each included in the tuning pulse generator and AFT pulse generator. That is, such an increase in the number of bits can cause a smaller change in the tuning voltage, or a local oscillator frequency, as produced by application of a one-shot AFT clock pulse. Such a solution method requires a longer time for AFT control. Still another solution method is to make the response of the lowpass filter fast. By so doing, a ripple voltage eliminating capability of the lowpass filter will be reduced.

The magnitude of the analog control voltage which is superposed onto the output voltage $V_T$ of the lowpass filter 17 is set to such an extent as to inpart no influence to the channel selection operation which is effected by the output voltage $V_T$. To this end, the output AFT2 of the AFT discriminator 20 is coupled by a high resistance $R_1$ of, for example, 2 megohms to the output of the lowpass filter 17. The lowpass filter 17 having an emitter follower output stage has an output resistance $R_2$ of about 10 kiloohms. Accordingly, the analog output voltage AFT2 is divided by a factor of about 200 and superposed onto the output voltage $V_T$ of the lowpass filter 17.

Figure 2:
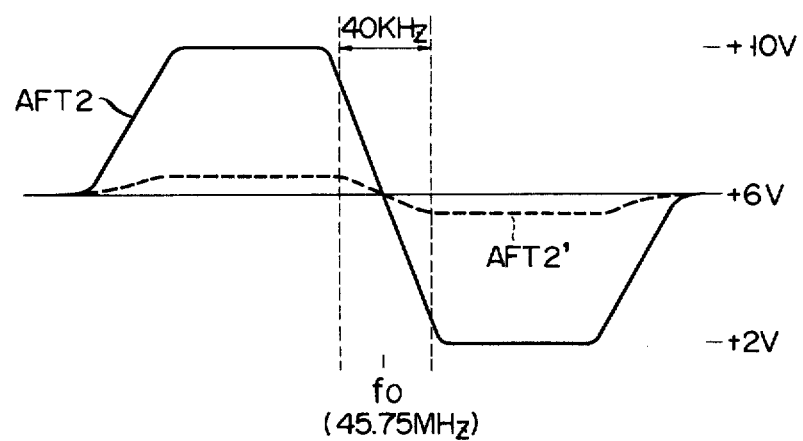
FIG. 2 is a view showing the frequency characteristic of the analog output voltage of an AFT discriminator of FIG. 1.

FIG. 2 shows a frequency characteristic of the output voltage AFT2 of the AFT discriminator 20 which is centered at 45.75 MHz. AFT2' shows a divided-voltage of AFT2 to be superposed onto the output voltage $V_T$ of the lowpass filter 17. If during the AFT operation under the AFT clock pulse $F_4$ the output carrier intermediate frequency of the tuner falls within the allowable range of $\pm$20 KHz with 45.75 MHz at the center, the AFT detector 21 produces an output signal Z, terminating the AFT operation. If, however, the width of variation of the output carrier frequency caused by a one-shot AFT clock pulse F$_4$ is greater than 40 KHz, the output carrier intermediate frequency skips beyond the allowable range and shifts upon or down outside the allowable range due to subsequent AFT controls, resulting in no termination of the AFT operation. According to this invention, since a small fraction of analog voltage is superposed onto the output voltage of the lowpass filter 17, the output carrier intermediate frequency can be pulled eventually into the allowable range.

Although various configurations can be used as the mixer circuit, if a resistor is provided to connect the output of the AFT discriminator to the output of the lowpass filter, the arrangement may become simpler and more economical.

FIG. 3 shows in greater detail the arrangements of the tuning pulse generator 14 and AFT pulse generator 22 of FIG. 1. The parts of FIG. 3 the same as those of FIG. 1 are denoted by the same numerals, description thereof being omitted.

The tuning pulse generator 14 is comprised of counters 31 and 32, gates 33 and 34, shift register 35, comparator 36, decoder 37 and latch circuit 38. The AFT pulse generator 22 is comprised of counters 41 and 42, gate 43, comparator 44, decoders 45 and 47 and latch circuit 46.

The counter 31 is supplied with the clock pulse CK1 from the clock pulse generator 15, and the counter 32 is supplied with the clock pulse CK2 through the gate 33. This gate 33 is disabled by the output signal Z of the AFT detector 21, and is enabled by a non-lock type gate-enabling switch used for the setting of a tuning voltage. The counters 31, 32 are of, for example, a 12-bit synchronous type, and initially reset when a power supply is turned on. The clock pulse CK2 has a frequency of 512 Hz which is obtained by dividing the frequency of the clock pulse CK1 by a factor of 4096 ($=2^{12}$). Accordingly, each time the counter 31 counts clock pulses CK1 by 4096 (the full-count number of counter 31), one clock pulse CK2 is applied to the counter 32. A number counted by the counter 32 is loaded into the register 35 through the select gate 34 during the write mode which is set by a read/write control switch.

The decoder 37 is constituted by a NAND or NOR gate to detect a predetermined count number of the counter 31, for example, an initial count of zero. Each time the decoder 37 detects the initial count the latch circuit 38 is set to make its output high. The comparator 36 carries out comparison between a count number in the counter 32 loaded into the register 35 and a count number in the counter 31. When coincidence arises between both count numbers, the comparator 36 resets the latch circuit 38 to make its output low. A timing in which the comparator 36 resets the latch circuit 38 is shifted by one period of the clock pulse CK1, each time the counter 31 counts the clock pulses CK1 by the full count number. As a result, the latch circuit 38 produces a pulse train which has a fixed period equal to the full count time (1/512 sec) of the counter 31 and whose pulse duration varies in steps of the fixed period/4096 for each 1/512 sec. When supplied with a pulse train whose pulse duration is stepwise increased, the lowpass filter 17 generates an output tuning voltage which increases similarly stepwise.

When the tuner 18 is made to accurately tune to a particular television channel by the variation of the tuning voltage, the AFT detector 21 produces the gate-disabling signal Z to disable the gate 33. As a result, clock pulses CK2 are prevented from being supplied to the counter 32, thereby fixing a count number in the counter 32. This fixed count number in the counter 32 leads to the fixation of the pulse duration of output tuning pulse train from the latch circuit 38 and an output tuning voltage VT of the lowpass filter 17. The fixed count number in the counter 32 is stored through the gate 34 in that memory location of the memory circuit 11 which corresponds to the selected television channel by operation of a memory switch. The setting of a tuning voltage VT for any other selected television channel is carried out by enabling the gate 33 through operation of the gate-enabling switch. With the other television channels, counts made by the counter 32 are stored in the corresponding memory locations of the memory circuit 11.

During the read mode, the select gate 34 is changed over to feed digital information stored in the memory circuit 11 to the register 35. During the read mode, the pulse duration of a tuning pulse train from the latch circuit 38 is fixed and constitutes a function of digital information read out of the memory circuit 11.

The AFT pulse generator 22 remains inoperative during the write mode, and is operated only during the read mode. The counter 41 may be of the 12-bit synchronous type and counts clock pulses CK1 from the clock pulse generator 15 in synchronism with the counter 31. The initial count zero of the counter 41 is detected by the decoder 45 formed of a NAND or NOR gate. Each time the initial count zero of the counter 41 is detected, the decoder 45 sets the latch circuit 46 to make its output high. The clock pulse CK2 is applied to the clock changer 24 where it is frequency-divided. Frequency-divided clock pulses are selectively supplied to the AFT counter 42 through the gate 43 over the intervals of the AFT control. The counter 42 is of a 12-bit synchronous up/down type, and is reset to an initial count by a reset signal at the beginning of the AFT control. The clock changer 25 is also reset to an initial state by the reset signal. Comparison is made between count numbers in the counters 41 and 42 by the comparator 44 and when coincidence takes place therebetween, the latch circuit 46 is reset to make its output low. The latch circuit 46 produces the AFT pulse train having the same period as the tuning pulse train from the latch circuit 38. The rising edge of the AFT pulse coincides with that of the tuning pulse, and the duration of AFT pulse varies during the AFT control with a count number in the AFT counter 42. This AFT counter 42 operates as a down counter when the AFT detector 21 produces the output signal X showing that an output carrier frequency of the tuner 18 is too low and acts as an up counter when the AFT detector produces the output signal Y showing that an output carrier frequency of the tuner 18 is too high. A decoder 47 is provided to detect the initial count value "0" and full count value "$2^{12}-1$" of the AFT counter 42.

The matrix control circuit 23 is responsive to the outputs X and Y of the AFT detector 21 and the output of decoder 47 to cause the matrix circuit 16 to act as an adder when the output X of AFT detector 21 is high at the beginning of the AFT control, and to act as a subtractor when the output Y of AFT detector 21 is high at the beginning of the AFT control.

What we claim is:

1. An electronic digital channel selection apparatus comprising:

digital signal generating means responsive to the selection of a channel to produce a digital signal corresponding to the selected channel;

digital-to-analog converter means for converting the digital signal to an analog tuning voltage;

voltage-controlled tuner means connected to said digital-to-analog converter means for converting a carrier frequency on the selected channel to an intermediate carrier frequency;

automatic fine tuning discriminator circuit means connected to said voltage-controlled tuner means and having an S-shaped frequency-voltage response centered at a predetermined intermediate frequency to produce an analog voltage signal whose magnitude depends upon the output carrier intermediate frequency of said voltage-controlled tuner means;

automatic fine tuning circuit means connected to said automatic fine tuning discriminator means and said digital-to-analog converter means for varying the tuning voltage of said digital-to-analog converter means in response to an output of the automatic fine tuning discriminator circuit means; and mixer means connected between said digital-to-analog converter means and said voltage-controlled tuner means for mixing a fraction of the analog voltage signal provided at an output of said automatic fine tuning discriminator circuit means with the tuning voltage provided at an output of said digital-to-analog converter means.

2. An electronic digital channel selection apparatus according to claim 1 wherein said digital signal generating means comprises a memory circuit for storing digital signals corresponding to a plurality of channels, the digital signal being read out of said memory circuit in response to selection of the channel.

3. An electronic digital channel selection apparatus according to claim 1 or 2 wherein said mixer means comprises a resistor for coupling the analog voltage signal to the output of said digital-to-analog converter means.

* * * * *